(12) United States Patent
Jeong et al.

(10) Patent No.: US 7,078,332 B2
(45) Date of Patent: Jul. 18, 2006

(54) METHOD FOR MANUFACTURING SEMICONDUCTOR DEVICE

(75) Inventors: Cheol Mo Jeong, Kyungki-Do (KR); Tae Kyung Kim, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 19 days.

(21) Appl. No.: 10/880,035

(22) Filed: Jun. 29, 2004

(65) Prior Publication Data
US 2005/0095838 A1    May 5, 2005

(30) Foreign Application Priority Data
Nov. 4, 2003    (KR)    ........................ 10-2003-0077490

(51) Int. Cl.
*H01L 21/4763* (2006.01)
(52) U.S. Cl. ...................... 438/622; 438/634; 438/637; 257/758
(58) Field of Classification Search ................. 438/622
See application file for complete search history.

(56) References Cited

U.S. PATENT DOCUMENTS

| | | | | |
|---|---|---|---|---|
| 6,531,407 B1 * | 3/2003 | Huang et al. | ................ | 438/758 |
| 6,885,105 B1 * | 4/2005 | Kakamu et al. | ............ | 257/774 |
| 2005/0151262 A1 * | 7/2005 | Tamaru et al. | .............. | 257/758 |

FOREIGN PATENT DOCUMENTS

| KR | 1020010027671 A | 4/2001 |
|---|---|---|
| KR | 1020020011476 A | 2/2002 |

* cited by examiner

*Primary Examiner*—Carl Whitehead, Jr.
*Assistant Examiner*—Colleen E. Rodgers
(74) *Attorney, Agent, or Firm*—Marshall, Gerstein & Borun LLP

(57) ABSTRACT

The present invention discloses a method for manufacturing a semiconductor device, comprising the steps of: providing a semiconductor substrate on which cell strings are formed and in which a plurality of conductive regions are formed; sequentially forming a first interlayer insulation film and a first etch barrier film on the semiconductor substrate; forming a plurality of contact holes by exposing the plurality of conductive regions formed in the semiconductor substrate, wherein an impurity concentration of the conductive regions is reduced due to the process for forming the contact holes; filling a metal material in the contact holes and forming a plurality of contact plugs; sequentially forming a second interlayer insulation film, a second etch barrier film and a third interlayer insulation film over a resulting structure including the contact plugs; forming a plurality of metal line patterns, wherein the metal line patterns pass through the third interlayer insulation film, the second etch barrier film and the second interlayer insulation film and contact to the contact plugs; forming a fourth interlayer insulation film over a resulting structure including the plurality of metal line patterns; forming a plurality of metal line contact holes by patterning the fourth interlayer insulation film; and forming a plurality of metal line contact plugs in the plurality of metal line contact holes by filling a metal material in the metal line contact holes.

7 Claims, 4 Drawing Sheets

METHOD FOR MANUFACTURING SEMICONDUCTOR DEVICE

BACKGROUND

1. Field of the Invention

The present invention relates to a method for manufacturing a semiconductor device, and more particularly to, a method for forming metal lines in a NAND flash memory device.

2. Discussion of Related Art

FIG. 1 is a cross-sectional diagram illustrating a conventional metal line structure of a NAND flash memory device. A conventional method for forming metal lines will now be explained with reference to FIG. 1.

Referring to FIG. 1, a first contact plug 14 exposing a conductive region in a predetermined region of a semiconductor substrate 10b including cell strings 10a is formed by patterning a first interlayer insulation film 12 on the whole surface of the semiconductor substrate 10b.

A second contact plug 18 exposing a conductive region except the conductive region in which the first contact plug 14 has been formed is formed by patterning a first interlayer insulation film 12 and a second interlayer insulation film 16 over the resulting structure.

First metal lines 28a, 28b and 28c exposing a conductive region except the conductive region in which the first contact plug 14 and the second contact plug 18 have been formed are formed by forming an etch barrier film 20 and a third interlayer insulation film 22 over the resulting structure, and patterning the first, second and third interlayer insulation films 12, 16 and 22. Second metal lines 24 and 26 stacked on the first contact plug 14 and the second contact plug 18 are formed by patterning the second and first interlayer insulation films 16 and 12.

Third contact plugs 32a, 32b and 32c exposing the first metal lines 28a, 28b and 28c and the second metal lines 24 and 26 are formed by forming a fourth interlayer insulation film 30 over the resulting structure, and patterning the fourth interlayer insulation film 30.

However, the conventional method for forming the multi-layer line structure in the NAND flash memory device has the following disadvantages.

First, a contact hole is formed through the first, second and third interlayer insulation films during the process for forming the first metal lines. Therefore, an aspect ratio of the contact hole increases, and thus the contact hole is not efficiently filled.

Second, an ion implant process for increasing an impurity concentration which may be reduced in an impurity region after the process for forming the contact hole is performed three times, namely, after forming the contact hole for forming the first contact plug, after forming the second contact hole for forming the second contact plug, and after forming patterns for forming the first metal lines. In order to perform the ion implant process three times, a plurality of processes such as a masking operation are required to prevent ions from being implanted into other films. Accordingly, steps of the whole process are complicated.

Third, the first and second contact plugs and the first metal lines use different metal materials, to complicate the steps of the process.

SUMMARY OF THE INVENTION

The present invention is achieved to solve the above problems.

One object of the present invention is to efficiently fill a contact hole by decreasing an aspect ratio of the contact hole.

Another object of the present invention is to prevent process failures from occurring in a process for forming metal lines due to a plurality of ion implant processes for increasing an impurity concentration which may be reduced in an impurity region after the process for forming the contact hole, by decreasing a number of the ion implant processes.

Yet another object of the present invention is to reduce steps of a process for forming multi-layer metal lines.

The present invention is directed to a method for manufacturing a semiconductor device which can achieve the above objects.

One aspect of the present invention is to provide a method for manufacturing a semiconductor device, comprising the steps of: providing a semiconductor substrate including conductive regions in a cell region, and a gate electrode and conductive regions in a peripheral region; sequentially forming a first interlayer insulation film and a first etch barrier film on the semiconductor substrate; forming a plurality of contact holes at once by patterning the first interlayer insulation film and the first etch barrier film to expose conductive regions in a cell region, and a gate electrode and conductive regions in a peripheral region; performing an ion implantation to increase an impurity concentration of the conductive regions in a cell region, and a gate electrode and conductive regions in a peripheral region; filling a first metal material in the plurality of contact holes and forming a plurality of contact plugs; sequentially forming a second interlayer insulation film, a second etch barrier film and a third interlayer insulation film over a resulting structure including the plurality of contact plugs; forming a plurality of metal lines filling by a second metal material, wherein the plurality of metal lines pass through the third interlayer insulation film, the second etch barrier film and the second interlayer insulation film and contact to the plurality of contact plugs; forming a fourth interlayer insulation film over a resulting structure including the plurality of metal lines and the third interlayer insulation film; forming a plurality of metal line contact holes by patterning the fourth interlayer insulation film; and forming a plurality of metal line contact plugs in the plurality of metal line contact holes by filling a third metal material in the metal line contact holes.

DETAILED DESCRIPTION OF PREFERRED EMBODIMENTS

Figure 1:
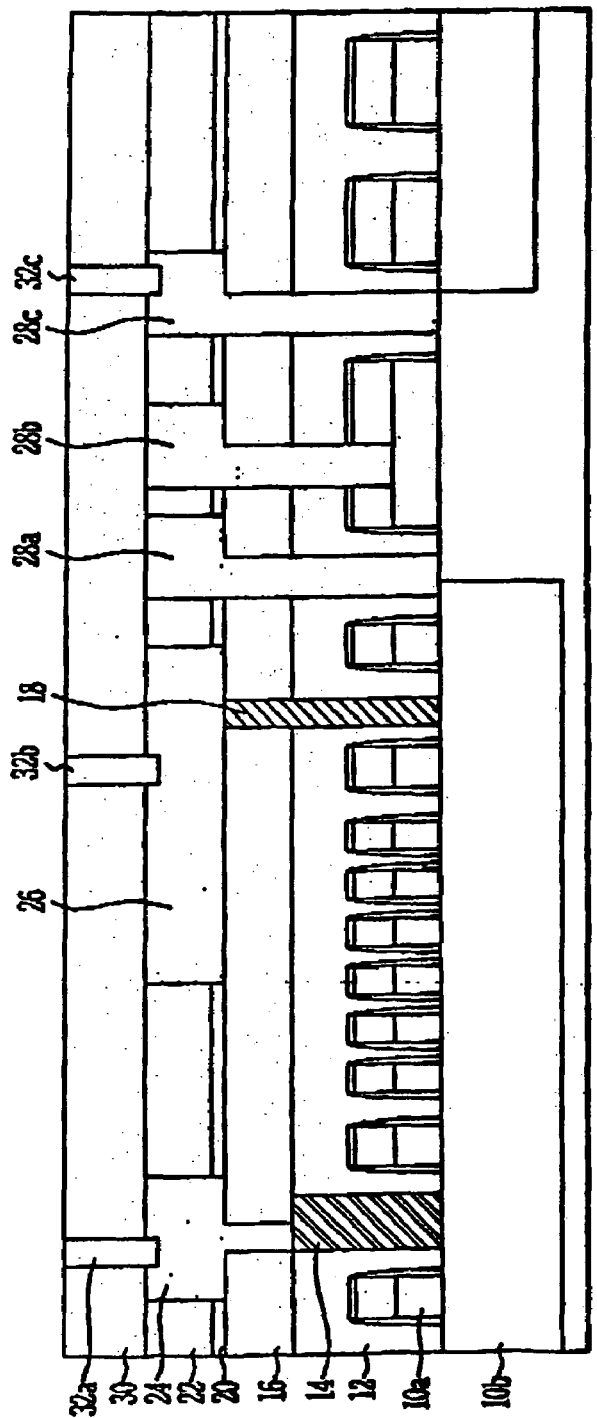
FIG. 1 is a schematic cross-sectional diagram illustrating a conventional metal line structure of a semiconductor device.

A method for manufacturing a semiconductor device in accordance with a preferred embodiment of the present invention will now be described in detail with reference to the accompanying drawings. In the drawings, a thickness of a film is exaggerated to emphasize clear and accurate explanations. Wherever possible, the same reference numerals will be used throughout the drawings and the description to refer to the same or like parts. In addition, in the case that it is described that one film is disposed on or contacts another film or a semiconductor substrate, one film can directly contact another film or the semiconductor substrate, or the third film can be positioned between them.

Figure 2:
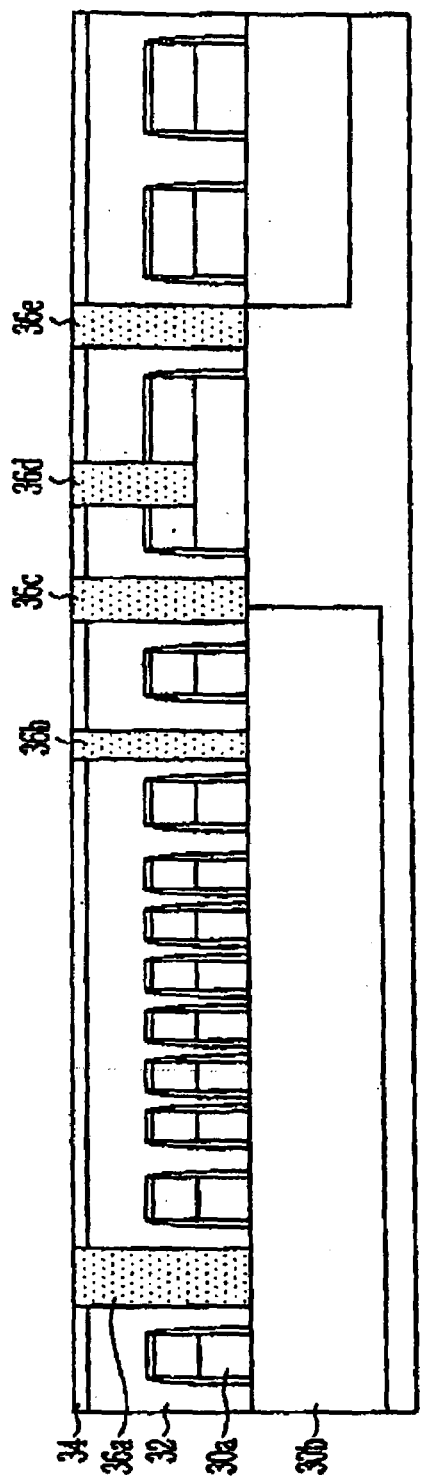
FIGS. 2 to 4 are cross-sectional diagrams illustrating sequential steps of a method for manufacturing a semiconductor device in accordance with a preferred embodiment of the present invention.
Figure 3:
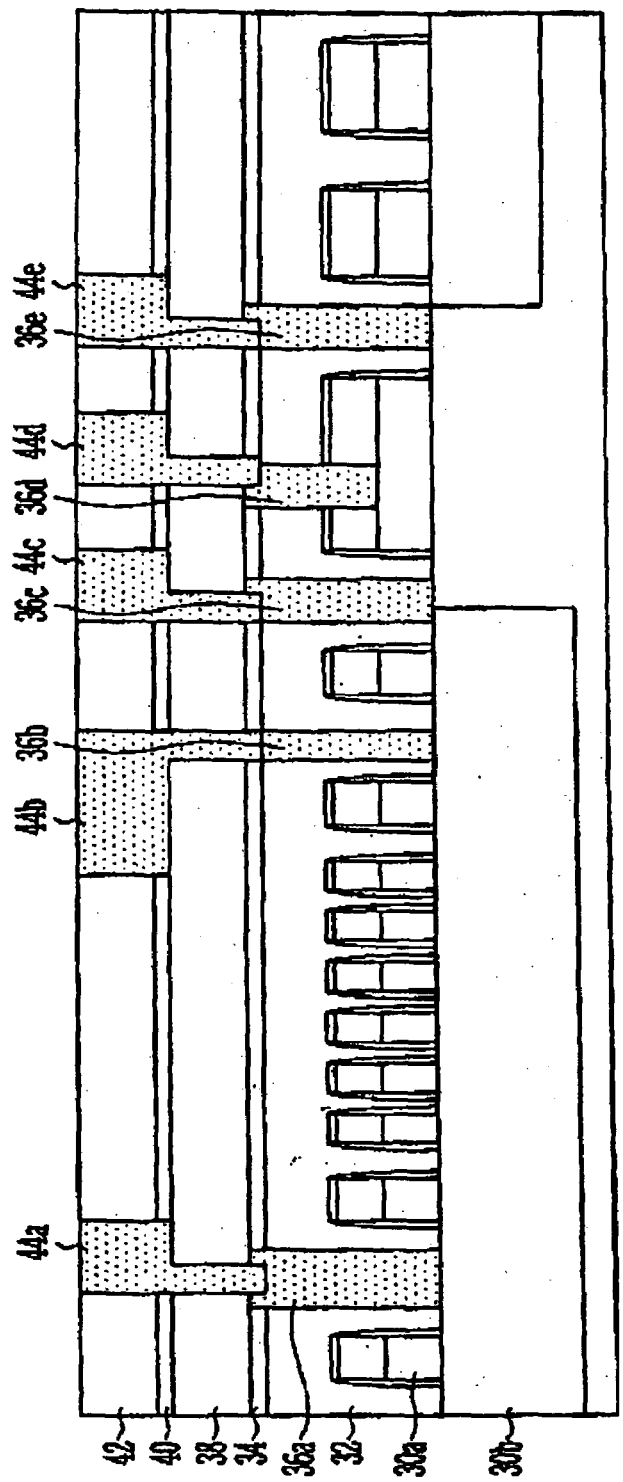
Figure 4:
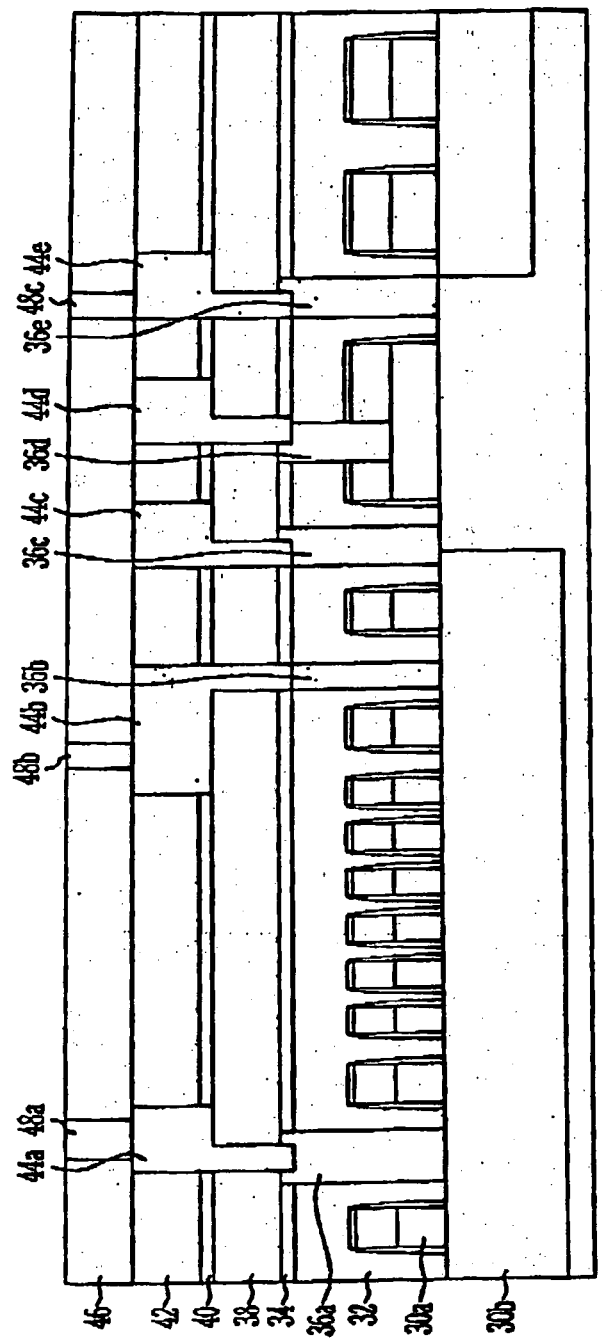

FIGS. 2 to 4 are cross-sectional diagrams illustrating sequential steps of a method for forming metal lines in a semiconductor device in accordance with a preferred embodiment of the present invention.

As illustrated in FIG. 2, an HDP oxide film 32 which is a first interlayer insulation film and a first silicon nitride film 34 which is an etch barrier film are sequentially formed on the whole surface of a semiconductor substrate 30b including cell strings 30a. The HDP oxide film 32 is formed at a thickness of 6500 Å, and the first silicon nitride film 34 is formed at a thickness of 300 Å. A source contact hole (not shown), a drain contact hole (not shown), a gate electrode contact hole (not shown) and an active region contact hole (not shown) are formed, respectively, by forming photoresist patterns (not shown) for defining each region in predetermined regions of the first silicon nitride film 34, namely, a source region-exposed region in a cell region, a drain region-exposed region in the cell region, a gate electrode region-exposed region in a peripheral region, and an active region-exposed region in the peripheral region, and performing an etching process using the photoresist patterns as an etch mask thereon. On the other hand, in this embodiment, the contact hole formation regions are restricted to the conductive regions, such as the source region, the drain region, the gate electrode region and the active region. However, it should be recognized that the contact holes can be formed in any kind of conductive regions.

An impurity concentration of the exposed bottom surfaces of the contact holes, namely, the exposed semiconductor substrate 30b is increased by performing an ion implant process on the resulting structure, thereby forming conductive regions.

A source contact plug 36a, a drain contact plug 36b, a gate electrode contact plug 36d and first and second active region contact plug 36c, 36e are formed at the same time, by forming a tungsten film over the resulting structure on which the ion implant process has been performed, and performing a planarization process such as a CMP process to expose the first silicon nitride film 34.

As shown in FIG. 3, a TEOS oxide film 38 which is a second interlayer insulation film, a second silicon nitride film 40 which is a second etch barrier film, and a silicon oxide film 42 which is a third interlayer insulation film are sequentially formed on the whole surface of the resulting structure on which the contact plugs have been formed.

The TEOS oxide film 38 is formed at a thickness of 3000 Å, the second silicon nitride film 40 is formed at a thickness of 300 Å, and the silicon oxide film 42 is formed at a thickness of 3000 Å.

Thereafter, first, second, third, fourth and fifth metal lines 44a, 44b, 44c and 44e are stacked on the source contact plug 36a, the drain contact plug 36b, the gate electrode contact plug 36d and the first and the second active region contact plugs 36c, 36e, respectively.

The first, second, third, fourth and fifth metal lines 44a, 44b, 44c and 44e are formed according to a dual damascene process. In more detail, predetermined regions of the silicon oxide film 42, namely, a photoresist pattern (not shown) for defining a via stacked on the source contact plug 36a, a photoresist pattern (not shown) for defining a via stacked on the drain contact plug 36b, a photoresist pattern (not shown) for defining a via stacked on the gate electrode contact plug 36d, and a photoresist pattern (not shown) for defining a via stacked on the first and the second active region contact plugs 36c, 36e are formed, respectively.

A via hole (not shown) exposing the source contact plug 36a, a via hole (not shown) exposing the drain contact plug 36b, a via hole (not shown) exposing the gate electrode contact plug 36d and a via hole (not shown) exposing the first and the second active region contact plugs 36c, 36e are formed by etching the silicon oxide film 42, the silicon nitride film 40 and the TEOS oxide film 38 by using the photoresist patterns (not shown) as an etch mask, respectively.

After removing the photoresist patterns (not shown), predetermined regions of the silicon oxide film 42, namely, a photoresist pattern (not shown) for defining a trench pattern in the via hole exposing the source contact plug 36a, a photoresist pattern (not shown) for defining a trench pattern in the via hole exposing the drain contact plug 36b, a photoresist pattern (not shown) for defining a trench pattern in the via hole exposing the gate electrode contact plug 36d, and a photoresist pattern (not shown) for defining a trench pattern in the via hole exposing the first and the second active region contact plugs 36c, 36e are formed, respectively.

The trench pattern (not shown) of the source contact plug 36a, the trench pattern (not shown) of the drain contact plug 36b, the trench pattern (not shown) of the gate electrode contact plug 36d, and the trench pattern (not shown) of the first and the second active region contact plugs 36c, 36e are formed by etching the silicon oxide film 42 and the silicon nitride film 40 by using the photoresist patterns (not shown) as an etch mask, respectively.

Accordingly, the via hole exposing the source contact plug 36a and the trench pattern, the via hole exposing the drain contact plug 36b and the trench pattern, the via hole exposing the gate electrode contact plug 36d and the trench pattern, and the via hole exposing the first and the second active region contact plugs 36c, 36e and the trench pattern are defined, respectively.

A first metal line 44a stacked on the source contact plug 36a, a second metal line 44b stacked on the drain contact plug 36b, a third metal line 44d stacked on the gate electrode contact plug 36d and a fourth and a fifth metal line 44c, 44e stacked on the first and the second active region contact plugs 36c, 36e are formed by filling tungsten on the whole surface of the resulting structure, and performing a planarization process such as a CMP process to expose the silicon oxide film 42.

In the preferred embodiment of the present invention, a via-first method is employed for the method for forming the metal lines by using the dual damascene process. However, all kinds of dual damascene processes can be used.

As shown in FIG. 4, a first metal line contact hole (not shown), a second metal line contact hole (not shown) and a third metal line contact hole (not shown) are stacked respectively on the first metal line 44a, the second metal line 44b and the third to fifth metal line 44d, 44c and 44e, by forming a second TEOS oxide film 46 which is a fourth interlayer insulation film over the resulting structure, and patterning the second TEOS oxide film 46.

A first metal line contact plug 48a stacked on the first metal line 44a, a second metal line contact plug 48b stacked on the second metal line 44b, and a third metal line contact plug 48c stacked on the third to fifth metal line 44d, 44c and 44e are formed by filling tungsten in the metal line contact holes (not shown), and performing a planarization process such as a CMP process to expose the second TEOS oxide film 46.

On the other hand, in this embodiment, tungsten is used as the metal material filled in the contact holes and the metal lines. However, aluminum, copper, and CVD TiN can also be used.

In accordance with the present invention, the method for manufacturing the semiconductor device has the following advantages.

First, only one metal material, namely, tungsten is used as the filling material of the contact holes, to reduce a number of processes.

Second, at least two-layer stack type contact plugs are formed by performing the process for forming the contact plugs on each layer, to improve contact filling conditions.

Third, the ion implant process is performed merely in the contact plug process exposing the conductive regions, and not performed on the succeeding stacked metal lines and metal line contact plugs, thereby reducing the number of the processes.

Fourth, the ion implant process is not performed on the succeeding stacked metal lines and metal line contact plugs. Therefore, a width of the interlayer insulation films is not reduced due to the ion implant process, thereby restricting crosstalk between the metal lines or the metal line contact plugs.

Fifth, when the lower contact plugs are damaged during the process for forming the metal lines which will be stacked thereon, the damaged contact plugs are filled in the process for filling the metal lines. Accordingly, the damaged contact plugs are reduced.

As discussed earlier, in accordance with the present invention, the method for manufacturing the semiconductor device has the following advantages.

First, only one metal material, namely, tungsten is used as the filling material of the contact holes, to reduce a number of processes.

Second, at least two-layer stack type contact plugs are formed by performing the process for forming the contact plugs on each layer, to improve contact filling conditions.

Third, the ion implant process is performed merely in the contact plug process exposing the conductive regions, and not performed on the succeeding stacked metal lines and metal line contact plugs, thereby reducing the number of the processes.

Fourth, the ion implant process is not performed on the succeeding stacked metal lines and metal line contact plugs. Therefore, a width of the interlayer insulation films is not reduced due to the ion implant process, thereby restricting crosstalk between the metal lines or the metal line contact plugs.

Fifth, when the lower contact plugs are damaged during the process for forming the metal lines which will be stacked thereon, the damaged contact plugs are filled in the process for filling the metal lines. Accordingly, the damaged contact plugs are reduced.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method for manufacturing a semiconductor device, comprising the steps of:
    providing a semiconductor substrate including conductive regions in a cell region and a gate electrode and conductive regions in a peripheral region;
    forming a first interlayer insulation film and a first etch barrier film on the semiconductor substrate;
    forming a plurality of contact holes at once by patterning the first interlayer insulation film and the first etch barrier film to expose the conductive regions in the cell region and the gate electrode and the conductive regions in the peripheral region;
    performing an ion implantation to increase an impurity concentration of the conductive regions in the cell region and the gate electrode and the conductive regions in the peripheral region;
    filling a first metal material in the plurality of contact holes and forming a plurality of contact plugs;
    forming a second interlayer insulation film, a second etch barrier film and a third interlayer insulation film over a resulting structure including the plurality of contact plugs;
    forming a plurality of metal lines by filling a second metal material, wherein the plurality of metal lines pass through the third interlayer insulation film, the second etch barrier film and the second interlayer insulation film and contact the plurality of contact plugs;
    forming a fourth interlayer insulation film over a resulting structure including the plurality of metal lines and the third interlayer insulation film;
    forming a plurality of metal line contact holes by patterning the fourth interlayer insulation film; and
    forming a plurality of metal line contact plugs in the plurality of metal line contact holes by filling a third metal material in the metal line contact holes.

2. The method of claim 1, comprising forming the plurality of metal lines by a dual damascene process.

3. The method of claim 2, wherein the dual damascene process includes the steps of:
    forming a plurality of via holes by patterning the third interlayer insulation film, the second etch barrier film and the second interlayer insulation film; and
    forming a plurality of trench patterns by patterning the third interlayer insulation film and the second etch barrier film.

4. The method of claim 1, wherein the first metal material is selected from the group consisting of W, Al, Cu, and CVD-deposited TiN.

5. The method of claim 1, wherein the second metal material is selected from the group consisting of W, Al, Cu, and CVD-deposited TiN.

6. The method of claim 1, wherein the third metal material filled in the metal line contact holes is one selected from the group consisting of W, Al, Cu, and CVD-deposited TiN.

7. The method of claim 1, wherein any one of the plurality of contact plugs and any one of the plurality of metal line contact plugs are coupled through any one of the plurality of metal lines.

* * * * *